(12) United States Patent
Gabara

(10) Patent No.: US 6,191,623 B1
(45) Date of Patent: Feb. 20, 2001

(54) MULTI-INPUT COMPARATOR

(75) Inventor: Thaddeus John Gabara, Murray Hill, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/162,851

(22) Filed: Sep. 29, 1998

(51) Int. Cl.[7] .............................. H03K 5/24; G06F 7/02
(52) U.S. Cl. .......................... 327/71; 327/58; 327/200; 327/67
(58) Field of Search ................................ 327/58, 59, 60, 327/67, 62, 199, 200, 201, 71, 63

(56) References Cited

U.S. PATENT DOCUMENTS

| | | | |
|---|---|---|---|
| 4,149,160 | * 4/1979 | Bozarth et al. | 327/50 |
| 4,962,341 | * 10/1990 | Schoeff | 327/535 |
| 5,381,054 | * 1/1995 | Standley | 327/63 |
| 5,400,007 | * 3/1995 | McClure | 327/64 |
| 5,818,267 | * 10/1998 | Fujio et al. | 327/58 |

OTHER PUBLICATIONS

S. Aur et al., "Identification of DRAM Sense–Amplifier Imbalance Using Hot Carrier Evaluation," IEEE Journal of Solid–State Circuits, vol. 27, No. 3, pp. 451–453, Mar. 1992.

* cited by examiner

Primary Examiner—Timothy P. Callahan
Assistant Examiner—Terry L. Englund
(74) Attorney, Agent, or Firm—Ryan, Mason & Lewis, LLP

(57) ABSTRACT

A multi-input comparator determines a minimum or maximum signal value in a given set of signal values. In an illustrative embodiment, a multi-input comparator includes a number of interconnected inversion circuits, with each of the inversion circuits having an input node associated therewith. The input node of each of the inversion circuits is coupled to an output of at least one of the other inversion circuits. As a result, after activation of the inversion circuits, the voltages at the input nodes are indicative of the relative magnitude of the signal values previously applied thereto. The inversion circuits may be constructed using, for example, single-inverter or multiple-inverter building blocks. Additional inputs can be provided by replicating the corresponding single-inverter or multiple-inverter blocks.

22 Claims, 5 Drawing Sheets

2-INPUT

3-INPUT

4-INPUT

MULTI-INPUT COMPARATOR

RELATED APPLICATION

The present application is related to the U.S. patent application Ser. No. 09/162,852. of Thaddeus J. Gabara and Syed Aon Mujtaba entitled "Multi-Input Comparator," filed concurrently herewith and assigned to the assignee of the present application.

FIELD OF THE INVENTION

The present invention relates generally to electronic circuits, and more particularly to comparator circuits which can support two or more inputs.

BACKGROUND OF THE INVENTION

Conventional comparators generally determine which of two inputs is the greater or the lesser of the two. An example of such a comparator is a sense amplifier typically used in applications such as dynamic random access memory (DRAM) cells. FIG. 1 shows a schematic diagram of a conventional sense amplifier 10 implemented using metal-oxide-semiconductor (MOS) field effect transistors. When the clock signal CK applied to sense amplifier 10 is at a logic low level, transistors MP1 and MN1 are off while transistor MPA is enabled. This equalizes the voltages at nodes A and B. At this time, a voltage difference can be introduced between A and B, since the resistance of MPA is very high. For example, the voltage at node A can be set higher than the voltage at node B by appropriate application of signal voltages to corresponding inputs $IN_A$ and $IN_B$, respectively. The clock signal CK is then permitted to go to a logic high level, such that transistors MP1 and MN1 are turned on, and transistor MPA is turned off. This activates the random access memory (RAM) cell made up of transistors MP2, MP3, MN2 and MN3. Since the voltage at node A was set to be higher than the voltage at node B, positive feedback through the cell transistors will cause node A to approach the supply voltage $V_{DD}$, while node B will approach the supply voltage $V_{ss}$, which may be ground potential. As a result, the initial difference established between the voltages at nodes A and B, which may have been on the order of several millivolts, can be amplified significantly.

Unfortunately, using conventional two-input comparators configured as shown in FIG. 1 to determine, for example, which of three inputs is greater or lesser than the others, generally requires comparisons of each pair of inputs and then further comparisons of the previous comparison results. Multi-input comparators configured in this manner can also exhibit excessive computation time and signal delay, in that each stage of comparison generally requires a separate cycle of the clock signal. Furthermore, such arrangements can require an unduly large amount of circuit area, and consume an excessive amount of power. A need therefore exists for an improved multi-input comparator which is more computationally efficient, requires less circuit area, and consumes less power than conventional multi-input comparators.

SUMMARY OF THE INVENTION

A multi-input comparator in accordance with the invention determines a minimum or maximum signal value in a given set of input signal values. In an illustrative embodiment, a multiinput comparator is configured using two or more interconnected inversion circuits, with each of the inversion circuits having an input node associated therewith. The input node of each of the inversion circuits is coupled to an output of at least one of the other inversion circuits. As a result of this feedback arrangement, after activation of the inversion circuits, the voltages at the input nodes are indicative of the relative magnitude of the signal values previously applied thereto.

In accordance with another aspect of the invention, the inversion circuits in the comparator may be constructed using, for example, single-inverter or multiple-inverter building blocks. A multiinput comparator with two inputs, three inputs, or more than three inputs can be constructed by replicating the corresponding single-inverter or multiple-inverter blocks. For example, one or more of the inversion circuits may be characterized as a two-inverter circuit with one output and more than one input, or as a two-inverter circuit with one input and more than one output. As another example, one or more of the inversion circuits may be characterized as a combination of two single-inverter circuits in which each of the inverters has one output and more than one input, or as a combination of two single-inverter circuits in which each of the inverters has one input and more than one output.

Advantageously, a multi-input comparator configured in accordance with the invention is more computationally efficient, requires less circuit area, and consumes less power than a conventional multi-input comparator. A comparator in accordance with the invention can be configured to include two or more inputs, and can be constructed in a straightforward manner by replicating inverter-based building blocks. These and other features and advantages of the present invention will become more apparent from the accompanying drawings and the following detailed description.

DETAILED DESCRIPTION OF THE INVENTION

The present invention will be illustrated herein using exemplary multi-input comparator circuits. It should be understood, however, that the invention is more generally suitable for use in any comparator circuit with two or more inputs. For example, the invention is applicable to comparator circuits based on sense amplifiers, as well as to comparator circuits based on other types of circuit arrangements. In addition, the invention can be used to implement a comparator circuit having two inputs, three inputs, or more than three inputs. The term "inversion circuit" as used herein should be understood to include any type of circuit which includes at least one inverter, such as, for example, a sense amplifier, a memory cell, a single-inverter circuit, a multiple-inverter circuit, a non-inverting circuit which includes at least one inverter (e.g., a circuit which includes two or more series-connected inverters but is otherwise end-to-end non-inverting), as well as portions or combinations of these and other circuits. The term "inverter" as used herein is intended to include not only inverter gates, but also any other arrangement of one or more gates or other types of circuitry which is capable of inverting a signal, such as, for example, a NAND gate with an input tied to logic high signal level, or a NOR gate with an input tied to a logic low signal level. The terms "activate" and "activation" as used herein refer generally to the application of a power source, e.g., a circuit is activated when it is supplied with power from one or more power sources.

Figure 1:
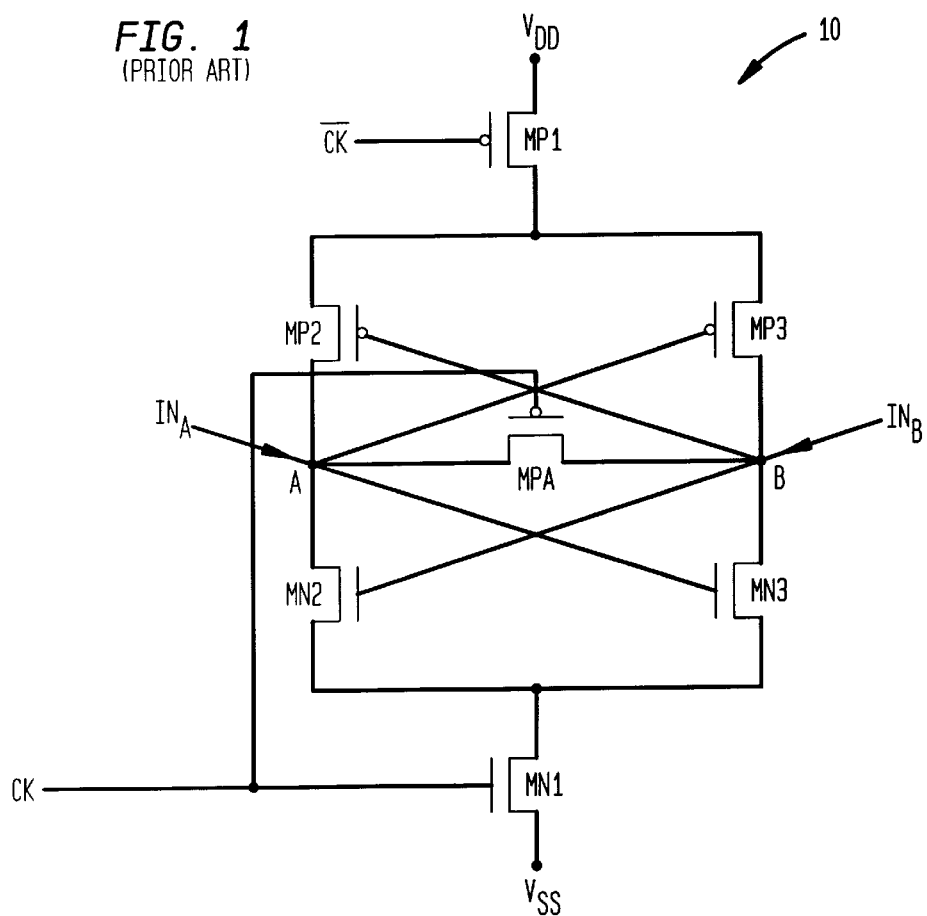
FIG. 1 is a schematic diagram of a conventional sense amplifier.
Figure 2:
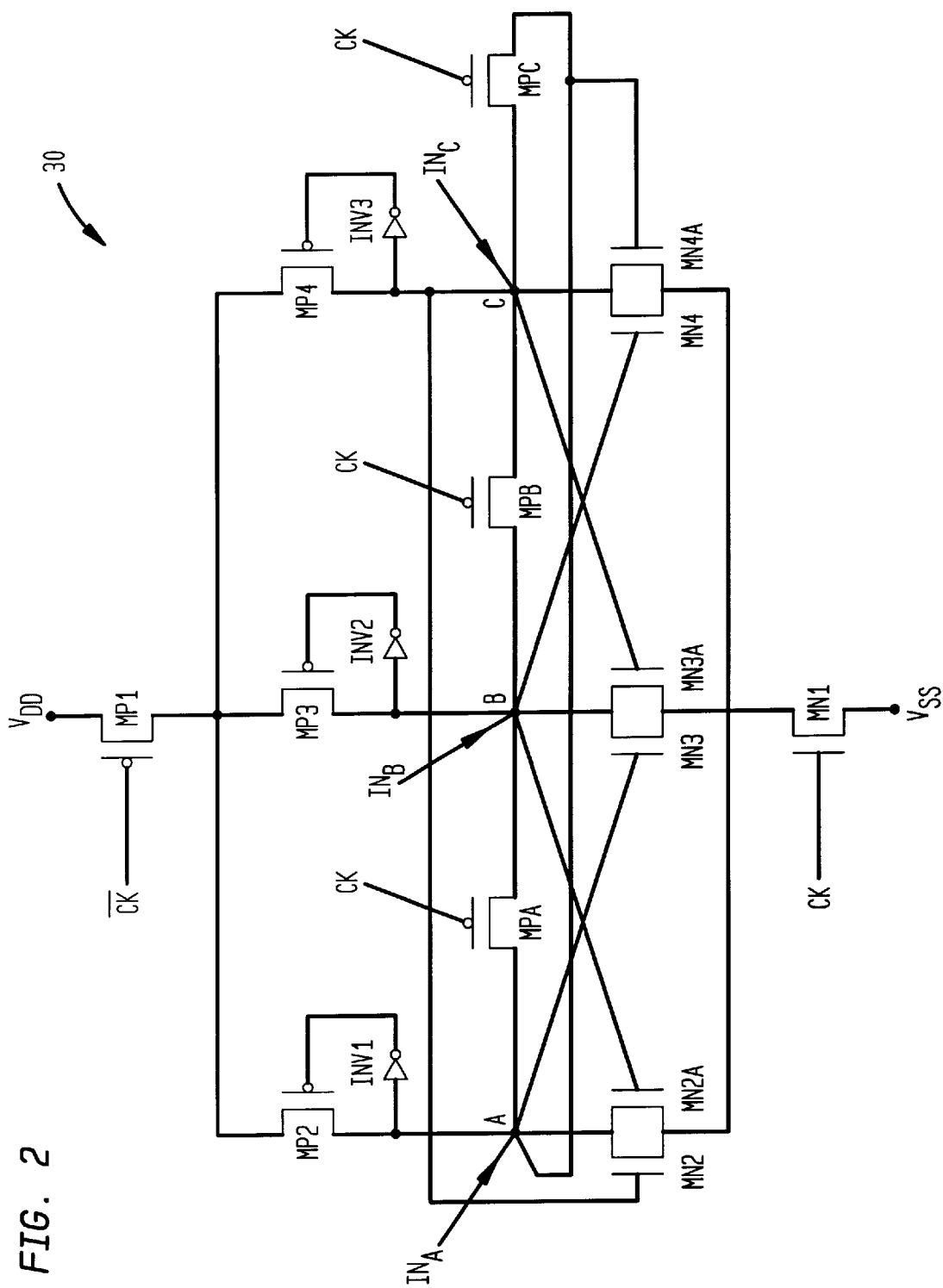
FIG. 2 shows an illustrative embodiment of a three-input comparator in accordance with the invention.

FIG. 2 shows an illustrative embodiment of a three-input comparator 30 in accordance with the invention. Like the conventional two-input sense amplifier 10 of FIG. 1, the three-input comparator 30 is implemented using metal-oxide-semiconductor (MOS) field effect transistors. MOS transistors are denoted herein by a reference which begins with the letter "M". The letter following "M" in the reference indicates the type of device, i.e., a "P" designates a p-type MOS transistor, and an "N" designates an n-type MOS transistor. Advantageously, the three-input comparator 30 can compare three input DC voltage levels, or other suitable signal values, in a single clock cycle, while also occupying less circuit area and consuming less power than a conventional three-input comparator arrangement.

The clock signal CK is used in comparator 30 in substantially the same manner as previously described in conjunction with the sense amplifier 10 of FIG. 1. When the clock signal CK applied to sense amplifier 30 is at a logic low level, transistors MP1 and MN1 are off while transistors MPA, MPB and MPC are enabled. This equalizes the voltages at nodes A, B and C. At this time, three different input signal levels can be introduced at nodes A, B and C, Via corresponding inputs $IN_A$, $IN_B$ and $IN_C$, respectively. since the resistance of each of the transistors MPA, MPB and MPC is very high. It should be noted that in the comparator 30, node C is connected to node A via transistor MPC. In addition, the nodes A, B and C are connected to the gates of the pairs of n-channel transistors MN3 and MN4A, MN2A and MN4, and MN2 and MN3A, respectively. Thus, the voltage at a given one of the three nodes can influence the discharge of the other two nodes. Inverters INVI, INV2 and INV3 are coupled between nodes A, B and C, respectively, and the gates of transistors MP2, MP3 and MP4, respectively, in a self-feedback arrangement. It should be noted that an alternative implementation of the comparator 30 of FIG. 2 could include cross-coupling such as that shown in FIG. 1, in place of the self-feedback arrangement shown in FIG. 2. The inverters INVI, INV2 and INV3 are enabled when the input voltage levels are applied to nodes A, B and C. Via corresponding inputs $IN_A$, $IN_B$ and $IN_C$, respectively. After the input voltage levels are applied to nodes A, B and C, the clock signal CK is permitted to go to a logic high level, such that transistors MP1 and MN1 are turned on, and transistors MPA, MPB and MPC are turned off. This arrangement allows the voltage levels on nodes A, B and C to react immediately upon a transition in the clock signal CK.

As an example, assume that the voltage level applied to node B is greater than that applied to node A or node C. As the clock signal CK goes high, transistors MN2A and MN4 are turned on harder than the other n-channel transistors MN2, MN3, MN3A and MN4A. Thus the nodes A and C pull down faster than node B. This also causes the inverters INV 1 and INV3 to turn off transistors MP2 and MP4, thereby allowing the voltage at nodes A and C to decrease faster than would otherwise be possible. This causes MN3 and MN3A to turn off, thereby allowing the feedback of inverter INV2 to enable transistor MP3 and pull up the voltage at node B toward the supply voltage $V_{DD}$. As a result, an initial difference established between the voltages at nodes A, B and C, which may have been on the order of several millivolts, can be amplified significantly and thus can be easily detected.

It will be apparent to those skilled in the art that the comparator 30 can be modified in a straightforward manner such that the output will correspond to the minimum value of the three inputs A, B and C. It should also be noted that the p-type and n-type transistors in the comparator 30 may be implemented as n-type and p-type transistors, respectively, and the $V_{DD}$ and $V_{ss}$ supplies interchanged, as is well known. Advantageously, the comparator circuit of FIG. 2 provides a considerable improvement in computation speed relative to a conventional arrangement, particularly as the number of inputs increases to three or more.

Figure 3A:
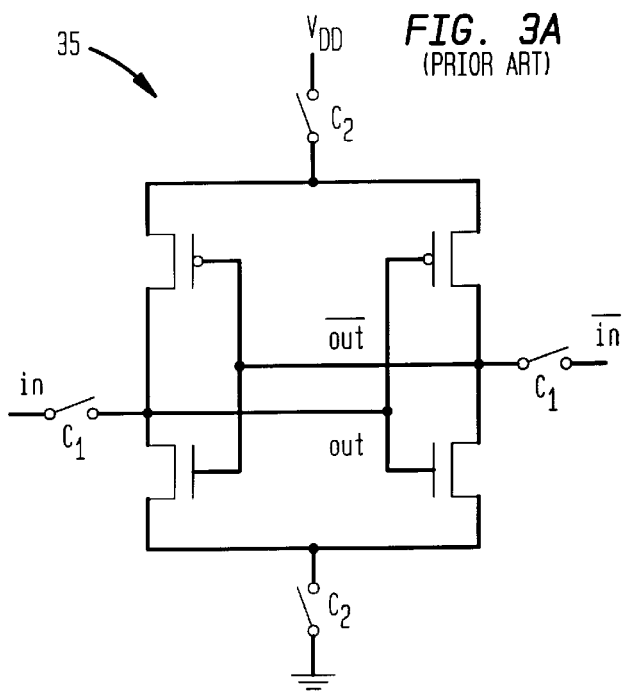
FIGS. 3A and 3B illustrate the configuration and operation of a basic sense amplifier.
Figure 3B:
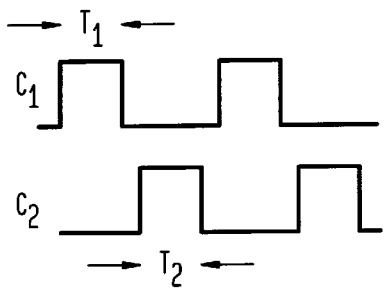

The structure of the illustrative three-input comparator of FIG. 2 can be generalized by first considering the operation of a conventional sense amplifier. FIGS. 3A and 3B illustrate the operation of a basic sense amplifier 35 which is similar to the sense amplifier 10 of FIG. 1. In this example, it is assumed that when $C_1$ or $C_2$ is at a logic high level, the corresponding switches are enabled and act as a short. When the switches corresponding to $C_1$ are enabled, as during the time period $T_1$ in FIG. 3B, the RAM cell portion of the sense amplifier 35 is powered down, and the sense amplifier 35 samples the signals applied to in and its complement onto the complement of out and out, respectively. Although the sense amplifier 35 of FIG. 3A will generally include a device comparable to MPA of FIG. 1, it is assumed for purposes of illustration that this device appears as an infinite resistance. When the switches corresponding to $C_2$ are enabled, as during the time period $T_2$ in FIG. 3B, the sense amplifier 35 of FIG. 3A operates as a RAM cell, and evaluates the stored values at out and its complement.

Figure 4A:
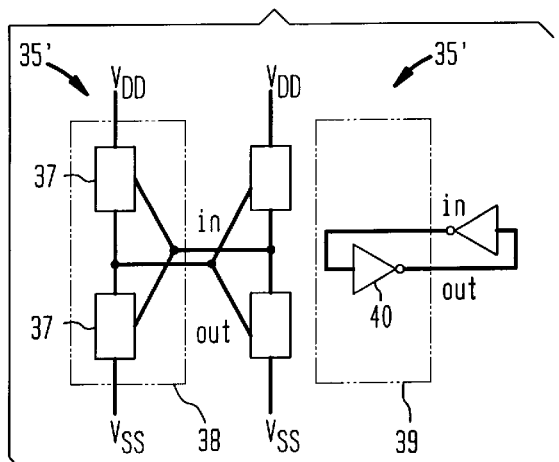
FIGS. 4A to 4E illustrate various representations of a RAM cell.
Figure 4B:
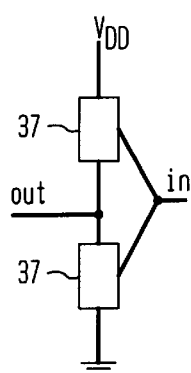
Figure 4C:
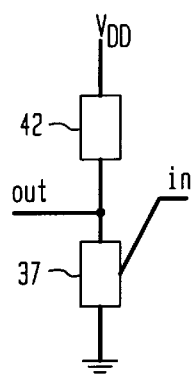
Figure 4D:
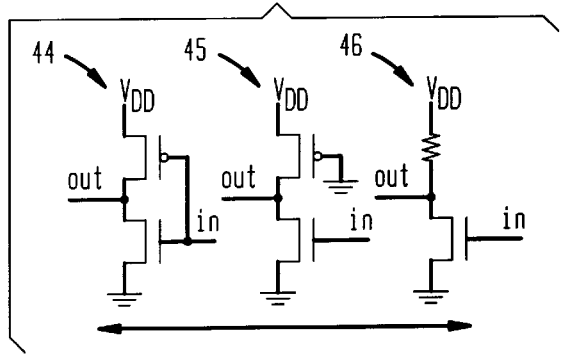
Figure 4E:
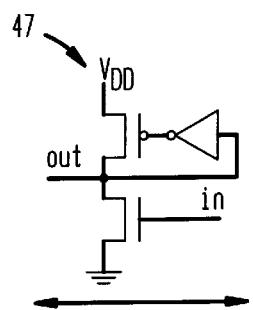

It will now be assumed that we are only interested in the sense amplifier 35 when $C_2$ becomes enabled, i.e., when it operates as a RAM cell. Two different representations of the resulting RAM cell 35' are shown in FIG. 4A. Each of the solid boxes 37 in FIG. 4A may contain transistors. The dotted boxes 38 and 39 are equivalent, which indicates that the dotted box 38 in FIG. 4A may be represented as an inverter 40 which has one input and one output. FIGS. 4B and 4C show possible arrangements of inverters with one input and one output. Again, solid boxes 37 generally contain transistors. FIGS. 4D and 4E show possible circuit implementations of the inverters of FIGS. 4B and 4C. Inverter 44 of FIG. 4D is a possible implementation of the inverter of FIG. 4B. The solid box 42 in FIG. 4C may contain, for example, a grounded transistor, as in inverter 45 of FIG. 4D, a resistor, as in inverter 46 of FIG. 4D, or a feedback circuit, as in inverter 47 of FIG. 4E. The inverters in FIG. 4D have gain in both directions. The inverter in FIG. 4E has gain in both directions, but is unable to recover from a false logic "0" at its out terminal.

Figure 5A:
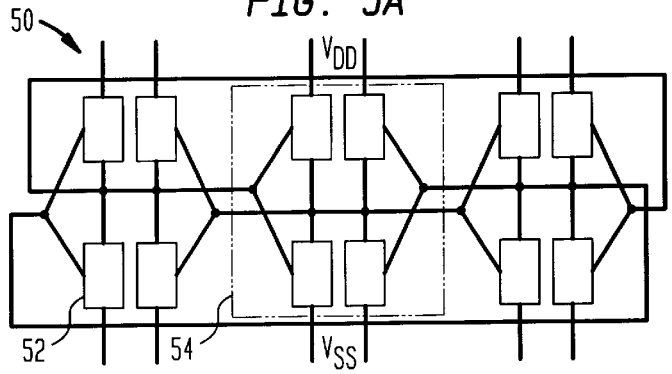
FIGS. 5A and 5B show generalized diagrams of a three-input comparator in accordance with the invention, based on an exemplary two-inverter building block.
Figure 5B:
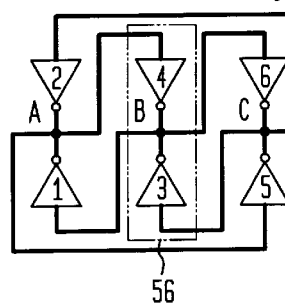

FIGS. 5A and SB show generalized diagrams of a three-input comparator in accordance with the invention, based on an exemplary two-inverter building block. It should be understood that circuitry which may be represented as a short or an open when the comparator is operating as a RAM cell is omitted in the drawings of FIGS. 5A through 14 for clarity of illustration. In the FIG. 5A diagram, a three-input comparator 50 is illustrated as an interconnected group of solid boxes 52, each of which corresponds generally to one or more transistors. In certain cases, one of the boxes 52 may alternatively include, for example, a grounded transistor, a resistor, or a transistor with feedback. The comparator 50 of FIG. 5A thus may be viewed as a generalized representation of the comparator 30 of FIG. 2. FIG. SB shows another representation 50' of the comparator 50. The dotted box 54 in FIG. 5A is equivalent to the dotted box 56 of FIG. 5B. Each of the dotted boxes 54, 56 has two inputs and one output and contains two inverters. The nodes A, B and C corresponding to the three inputs of the comparator are shown in FIG. 5B. The dotted boxes 54 and 56 correspond to a two-inverter building block which is replicated as shown to construct the three-input comparator. Additional blocks configured in a similar manner may be used to construct a comparator with additional inputs. These and other similar inverter-based building blocks represent examples of what are more generally referred to herein as "inversion circuits."

Figure 6A:
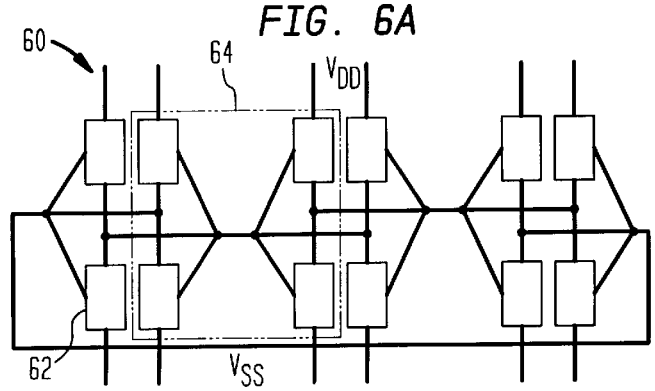
FIGS. 6A and 6B show generalized diagrams of a three-input comparator in accordance with the invention, based on another exemplary two-inverter building block.
Figure 6B:
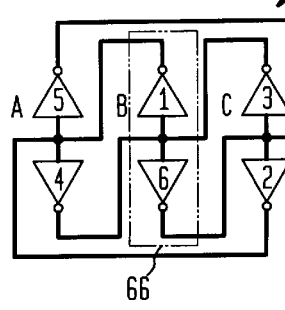

FIGS. 6A and 6B show generalized diagrams of another embodiment of a three-input comparator in accordance with the invention, based on another exemplary two-inverter building block. In the FIG. 6A diagram, a three-input comparator 60 is illustrated as an interconnected group of solid boxes 62, each of which corresponds generally to one or more transistors or other circuitry. FIG. 6B shows another representation 60' of the comparator 60. The dotted box 64 in FIG. 6A is equivalent to the dotted box 66 of FIG. 6B. Each of the dotted boxes 64, 66 has one input and two outputs and contains two inverters. The nodes A, B and C corresponding to the three inputs of the comparator are shown in FIG. 6B. Like the boxes 54 and 56 of FIGS. 5A and 5B, the dotted boxes 64 and 66 correspond to a two-inverter building block which is replicated as shown to construct the three-input comparator, and which may be further replicated to construct a comparator with additional inputs. It is apparent from the representations 50' and 60' in FIGS. 5B and 6B that the corresponding three-input comparators 50 and 60 of FIGS. 5A and 5B are identical in terms of their functionality and connectivity.

Figure 7A:
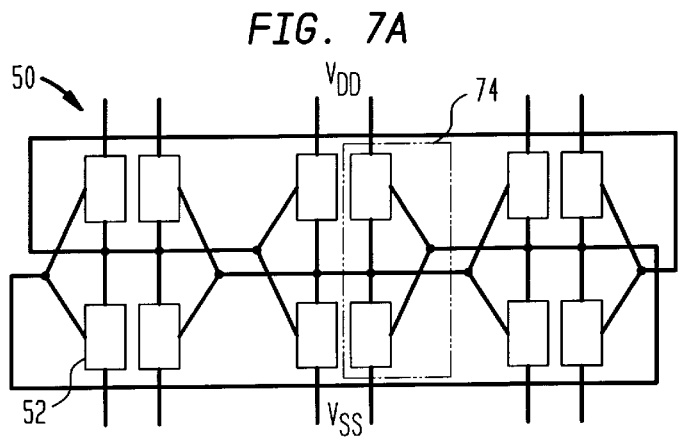
FIGS. 7A and 7B show generalized diagrams of a three-input comparator in accordance with the invention, based on an exemplary single-inverter building block.
Figure 7B:
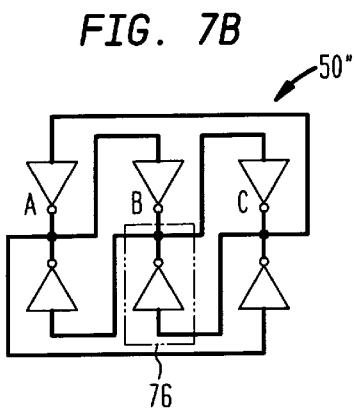

FIGS. 7A and 7B show a set of equivalent representations for the comparator 50 of FIG. SA, based on an exemplary single-inverter building block. In the FIG. 7A diagram, the three-input comparator 50 is again illustrated as an interconnected group of solid boxes 52, as described previously. FIG. 7B shows an equivalent representation 50" of the comparator 50. The dotted box 74 in FIG. 7A is equivalent to the dotted box 76 of FIG. 7B. Each of the dotted boxes 74, 76 contains a single inverter. The nodes A, B and C corresponding to the three inputs of the comparator are shown in FIG. 7B. The dotted boxes 74 and 76 correspond to a single-inverter building block which is replicated as shown to construct the three-input comparator 50. Again, additional blocks configured in a similar manner may be used to construct a comparator with additional inputs.

Figure 8A:
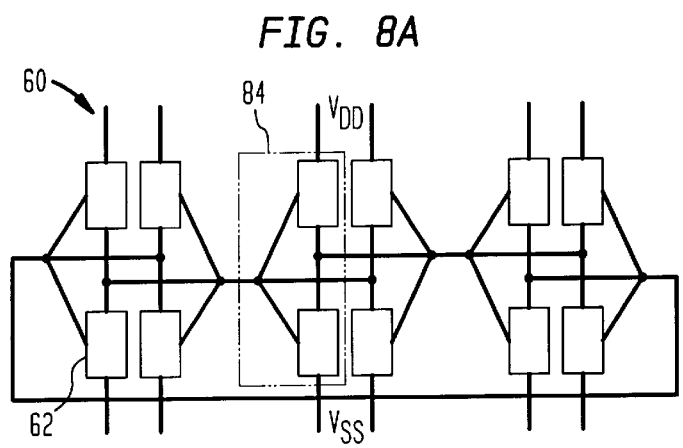
FIGS. 8A and 8B show generalized diagrams of a three-input comparator in accordance with the invention, based on another exemplary single-inverter building block.
Figure 8B:
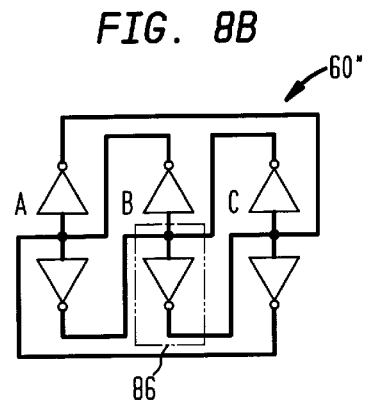

FIGS. 8A and 8B show a set of equivalent representations for the comparator 60 of FIG. 6A, based on another exemplary single-inverter building block. In the FIG. 8A diagram, the three-input comparator 60 is again illustrated as an interconnected group of solid boxes 62, as described previously. FIG. 8B shows an equivalent representation 60" of the comparator 60. The dotted box 84 in FIG. 8A is equivalent to the dotted box 86 of FIG. 8B. Each of the dotted boxes 84, 86 contains a single inverter. The nodes A, B and C corresponding to the three inputs of the comparator are shown in FIG. 8B. The dotted boxes 84 and 86 correspond to a single-inverter building block which is replicated as shown to construct the three-input comparator, and which may be further replicated to construct a comparator with additional inputs. It is apparent from the representations 50" and 60" in FIGS. 7B and 8B that the corresponding three-input comparators 50 and 60 of FIGS. 7A and 7B are identical in terms of their functionality and connectivity.

Figure 9:
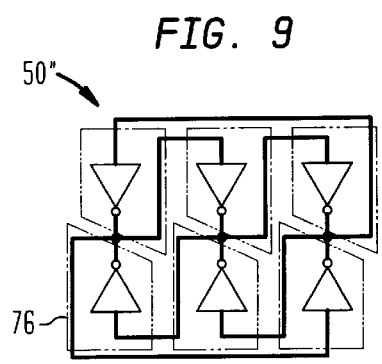
FIG. 9 shows a three-input comparator implemented using a single-inverter building block which has one input and more than one output.
Figure 10:
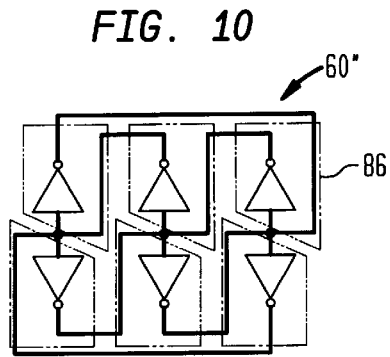
FIG. 10 shows a three-input comparator implemented using a single-inverter building block which has one output and more than one input.

FIGS. 9 and 10 show that each of the representations 50" and 60" of FIGS. 7B and 8B, respectively, can be implemented by replicating the corresponding single-inverter building blocks 76 and 86, respectively. In FIG. 9, the representation 50" includes six of the single-inverter building blocks 76, each of which has one input but more than one output. In FIG. 10, the representation 60" includes six of the single-inverter building blocks 86, each of which has one output but more than one input. Each of the representations 50" and 60" corresponds to a three-input comparator which is capable of detecting the maximum or minimum of three signal values applied thereto.

Figure 11:
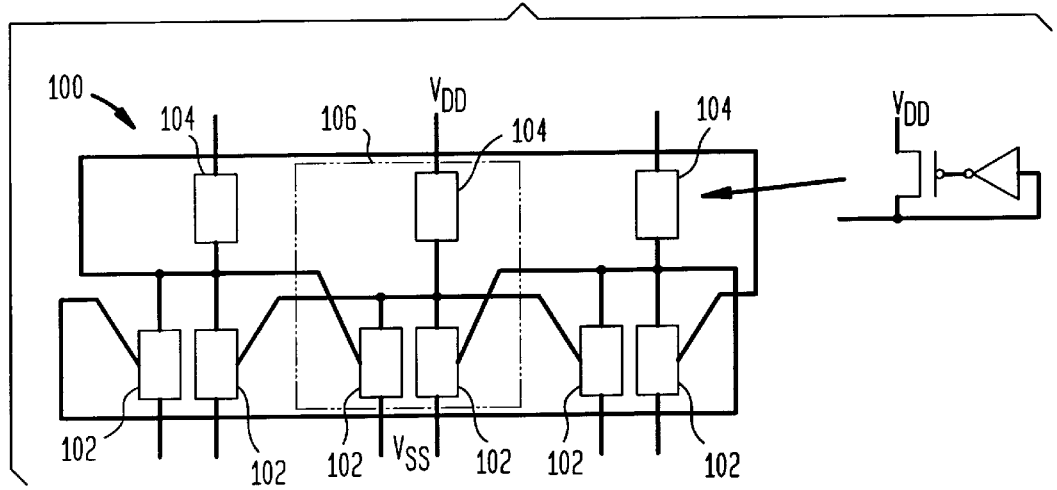
FIG. 11 shows a three-input comparator with self-feedback in accordance with the invention.

FIG. 11 shows a three-input comparator 100 with self-feedback in accordance with the invention. The comparator 100 may be viewed as another generalized representation of the comparator 30 of FIG. 2. As in the embodiments of FIG. 5A through FIG. 10, it is assumed that the comparator is in a mode in which it is operating as a RAM cell. The three-input comparator 100 is illustrated as an interconnected group of lower boxes 102 and upper boxes 104. Each of the lower boxes 102 corresponds generally to one or more transistors, and each of the upper boxes 104 corresponds to a transistor with feedback as shown. The comparator 100 as shown includes self-feedback to the upper blocks 104, and is capable of finding the maximum of three signal values. If the p-type and n-type transistors in the comparator 100 are implemented as n-type and p-type transistors, respectively, and the $V_{DD}$ and $V_{ss}$ supplies are interchanged, such that the self-feedback is then applied to the lower solid blocks, then the resulting comparator would find the minimum of the three applied values.

Figure 12:
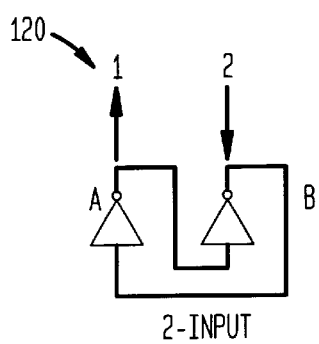
FIGS. 12, 13 and 14 show two-input, three-input and four-input comparators, respectively, in accordance with the invention.
Figure 13:
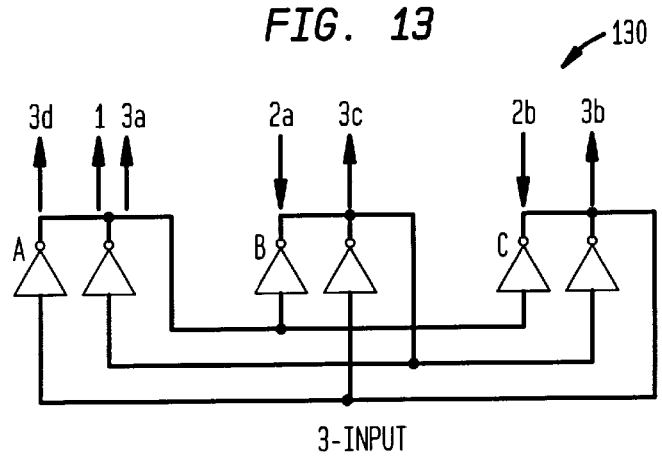
Figure 14:
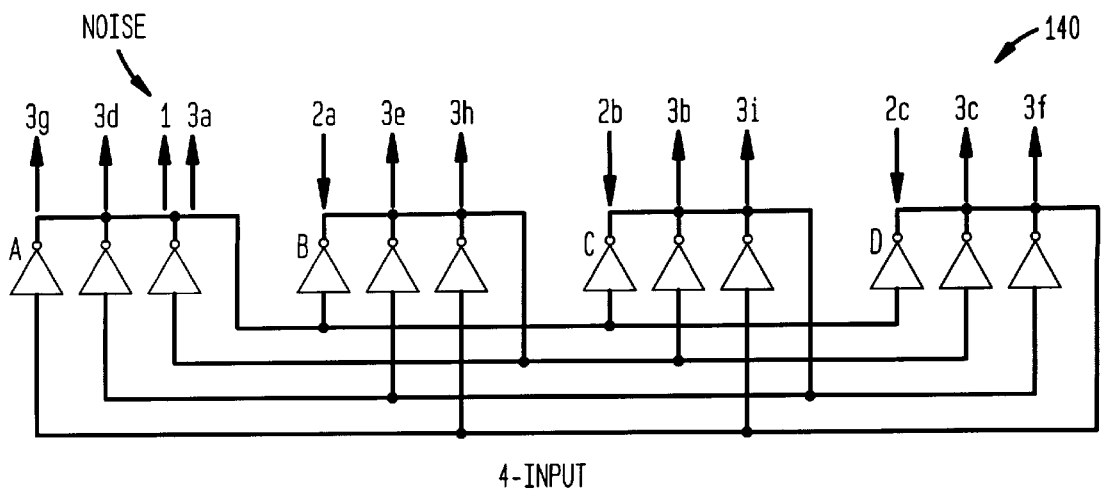

FIGS. 12, 13 and 14 show a two-input comparator 120, a three-input comparator 130 and a four-input comparator 140, respectively, in accordance with the invention. Each of these comparators is represented in the form of a group of interconnected inverters. It should again be understood that, as in the previous embodiments, circuitry which may be represented as a short or an open when the comparator is operating as a RAM cell is omitted for clarity of illustration. In the two-input comparator 120 of FIG. 12, if the voltages at nodes A and B are initially equal, and a small amount of additional positive voltage is introduced at node A as shown by 1, the other node, i.e., node B, would go to a logic low level as shown by 2.

In the three-input comparator 130 of FIG. 13, assume that the voltages at nodes A, B and C are initially equal. A small amount of additional positive voltage introduced at node A, as shown by 1, would generate a negative response at node B, as shown by 2a, and at node C, as shown by 2b. In turn, the response 2a would cause a positive result at node A, as indicated by 3a, and at node C, as indicated by 3b. The 2b response would generate a positive result at node A, as shown by 3d, and at node B, as shown by 3c. As long as 2a is greater than 3c and 2b is greater than 3b, the comparator will generate output logic levels of 1, 0 and 0 at nodes A, B and C, respectively.

In the four-input comparator 140 of FIG. 14, assume that the voltages at nodes A, B, C and D are initially equal. A small amount of additional positive voltage introduced at node A, as shown by 1, would generate a negative response at node B, as shown by 2a, at node C, as shown by 2b, and at node D, as shown by 2c. In turn, the response 2a would cause a positive result at node A, as shown by 3a, at node C, as shown by 3b, and at node D, as shown by 3c. The 2b response would generate a positive result at node A, as shown by 3d, at node B, as shown by 3e, and at node D, as shown by 3f. The 2c response would generate a positive result at node A, as shown by 3g, at node B, as shown by 3h, and at node C, as shown by 3i. As long as $2a>3e+3h$, $2b>3b+3i$, and $2c>3c+3f$, the comparator 140 will generate output logic levels of 1, 0, 0 and 0 at nodes A, B, C and D, respectively.

It should be emphasized that the exemplary multi-input comparators described herein are intended to illustrate the operation of the invention, and therefore should not be construed as limiting the invention to any particular embodiment or group of embodiments. For example, although illustrated using MOS circuitry, the invention can be implemented using any other type of transistor technology, including bipolar, GaAs, etc. The invention can be used with sense amplifiers or other comparison circuits that operate in ways other than that described herein. In addition, although particularly well suited for use with DC level values, the invention can also be applied to other types of signal values, including sampled analog signal values and digital signal values. Moreover, embodiments of the invention can be implemented in a wide variety of different configurations to accommodate the needs of particular applications. For example, comparators in accordance with the invention could be used to identify a subset of a given set of inputs, e.g., two of four inputs, which have larger or smaller magnitudes than the other inputs in the set. These and numerous other alternative embodiments within the scope of the following claims will therefore be apparent to those skilled in the art.

What is claimed is:

1. A comparator circuit having at least three inputs, the comparator circuit comprising:
   a first inversion circuit associated with a first input node of the comparator circuit;
   a second inversion circuit associated with a second input node of the comparator circuit; and
   at least one additional inversion circuit associated with an additional input node of the comparator circuit, wherein at least one of the first and second input nodes is coupled to an output of the at least one additional inversion circuit, and the additional input node associated with the at least one additional inversion circuit is coupled to an output of at least one of the first and second inversion circuits, and further wherein the comparator circuit is operative to generate a decision output signal indicative of a difference in input signal values associated with the first, second and additional input nodes of the comparator circuit.

2. The comparator circuit of claim 1 wherein the decision output signal is indicative of the relative magnitudes of signal values previously applied to the input nodes and is generated at the input nodes after removal of signal sources applied to the input nodes and activation of the inversion circuits.

3. The comparator circuit of claim 1 wherein the decision output signal indicates which of the input nodes has a maximum signal value applied thereto prior to activation of the inversion circuits.

4. The comparator circuit of claim 1 wherein the decision output signal indicates which of the input nodes has a minimum signal value applied thereto prior to activation of the inversion circuits.

5. The comparator circuit of claim 1 wherein at least one of the inversion circuits may be characterized as a circuit with at least one output and more than one input, a nd including two inverter s having their outputs coupled together.

6. The comparator circuit of claim 1 wherein at least one of the inversion circuits may be characterized as a circuit with at least one input and more than one output, and including two inverters having their inputs coupled together.

7. The comparator circuit of claim 1 wherein at least one of the inversion circuits may be characterized as a combination of two circuits, each of the two circuits including a single inverter with at least one output and more than one input.

8. The comparator circuit of claim 1 wherein at least one of the inversion circuits may be characterized as a combination of two circuits, each of the two circuits including a single inverter with at least one input and more than one output.

9. The comparator circuit of claim 1 wherein at least one of the inversion circuits includes a transistor circuit including at least one transistor with self-feedback.

10. A method of comparing at least three input signal values, comprising:
    applying the input signal values to a first input node of a comparator circuit, a second input node of the comparator circuit and at least one additional input node of the comparator circuit, wherein each of the input nodes is associated with a corresponding inversion circuit, at least one of the first and second input nodes is coupled to an output of the at least one additional inversion circuit, and the input node associated with the at least one additional inversion circuit is coupled to an output of at least one of the first and second inversion circuits; and
    generating a decision output signal indicative of a difference in input signal values associated with the first, second and at least one additional input nodes of the comparator circuit.

11. The method of claim 10 wherein the step of generating a decision output signal includes generating the decision output signal indicative of the relative magnitudes of the input signal values applied to the input nodes, after removal of the applied input signal values and activation of the inversion circuits.

12. The method of claim 10 wherein the step of generating a decision output signal includes generating the decision output signal which indicates which of the input nodes has a maximum signal value applied thereto prior to activation of the inversion circuits.

13. The method of claim 10 wherein the step of generating a decision output signal includes generating the decision output signal which indicates which of the input nodes has a minimum signal value applied thereto prior to activation of the inversion circuits.

14. A comparator circuit comprising:

at least three input nodes; and a plurality of interconnected inversion circuits, each having a particular one of the input nodes associated therewith, wherein at least one of the input nodes associated with a given one of the inversion circuits is coupled to an output of another one of the inversion circuits, and wherein the input node associated with the other inversion circuit is coupled to the input node of the given inversion circuit, and further wherein the comparator circuit is operative to generate a decision output signal indicative of a difference in input signal values associated with the at least three input nodes of the comparator circuit.

15. The comparator circuit of claim 14 wherein, after activation of the inversion circuits, the decision output signal is indicative of the relative magnitude of signal values previously applied to the at least three input nodes.

16. The comparator circuit of claim 14 wherein the decision output signal indicates which of the input nodes has a maximum signal value applied thereto prior to activation of the inversion circuits.

17. The comparator circuit of claim 14 wherein the decision output signal indicates which of the input nodes has a minimum signal value applied thereto prior to activation of the inversion circuits.

18. The comparator circuit of claim 14 wherein at least one of the inversion circuits may be characterized as a circuit with at least one output and more than one input, and including two inverters having their outputs coupled together.

19. The comparator circuit of claim 14 wherein at least one of the inversion circuits may be characterized as a circuit with at least one input and more than one output, and including two inverters having their inputs coupled together.

20. The comparator circuit of claim 14 wherein at least one of the inversion circuits may be characterized as a combination of two circuits, each of the two circuits including a single inverter with at least one output and more than one input.

21. The comparator circuit of claim 14 wherein at least one of the inversion circuits may be characterized as a combination of two circuits, each of the two circuits including a single inverter with at least one input and more than one output.

22. The comparator circuit of claim 14 wherein at least one of the inversion circuits includes a transistor circuit including at least one transistor with self-feedback.

* * * * *